(12) United States Patent
Sato

(10) Patent No.: US 6,305,969 B1
(45) Date of Patent: Oct. 23, 2001

(54) ELECTRICAL CONTINUITY CHECKER FOR CONNECTOR

(75) Inventor: Takayuki Sato, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/716,207

(22) Filed: Nov. 21, 2000

(30) Foreign Application Priority Data

Dec. 1, 1999 (JP) .................................. 11-341840

(51) Int. Cl.$^7$ .................................................. H01R 11/18
(52) U.S. Cl. ........................... 439/482; 439/700; 324/538
(58) Field of Search .................................. 439/76.1, 289, 439/310, 482, 700, 912; 324/538

(56) References Cited

U.S. PATENT DOCUMENTS

| | | | |
|---|---|---|---|
| 5,455,515 | * 10/1995 | Saijo et al. ............................ | 324/538 |
| 5,512,833 | * 4/1996 | Fukuda et al. ....................... | 324/538 |
| 5,586,900 | * 12/1996 | Yagi et al. ............................ | 439/310 |
| 5,629,627 | * 5/1997 | Hoshino et al. ..................... | 324/538 |
| 5,670,884 | * 9/1997 | Kodama ............................... | 324/538 |
| 5,694,043 | * 12/1997 | Kodama ............................... | 324/538 |
| 5,760,592 | * 6/1998 | Kodama et al. ..................... | 324/538 |
| 5,839,914 | * 11/1998 | Watanabe et al. ................... | 439/488 |

* cited by examiner

Primary Examiner—Khiem Nguyen
Assistant Examiner—Thanh-Tam T Le
(74) Attorney, Agent, or Firm—Armstrong, Westerman, Hattori, McLeland & Naughton, LLP

(57) ABSTRACT

A continuity sensing pin movable forward and backward has one end for contacting a terminal of a connector. An insertion inspecting pin has one end insertable into a deflection space of a flexible locking arm that locks the terminal in a housing of the connector. An electrically conductive slide is resiliently urged toward the terminal of the connector. The continuity sensing pin has an opposing end contacting a circuit conductor via a resilient member. The circuit conductor can contact the slide. The insertion inspecting pin has an opposing end that can abut against the slide. When the slide is energized by an external power source and the one end of the insertion inspecting pin abuts against the flexible locking arm, the opposing end of the insertion inspecting pin pushes the slide to disengage the slide from the circuit conductor. The circuit conductor is arranged on a circuit board. The circuit board has a through hole passing the opposing end of the insertion inspecting pin. The circuit conductor has a front part disposed on a front face of the circuit board and a rear part disposed on a rear face of the circuit board. The front part electrically communicates with the rear part via the through hole. The front part of circuit conductor can contact the resilient member and the rear part of the circuit conductor can contact the slide.

4 Claims, 4 Drawing Sheets

ELECTRICAL CONTINUITY CHECKER FOR CONNECTOR

FIELD OF THE INVENTION

The present invention relates to an electrical continuity checker for a connector, which can inspect electrical continuity of a terminal locked in the connector and can check a locking state of the terminal.

RELATED ART

FIG. 3 shows a known connector continuity checker 51. The connector continuity checker 51 senses mainly electrical continuity of a terminal (not shown) connected to an electrical wire and locked in a connector 52. The checker 51 has a connector receiving portion 54 fixed on a frame 53, an inspection portion 55 movable forward and backward relative to the connector receiving portion 54, and an actuating lever 57 for moving the inspection portion 55 through the link 56.

The connector receiving portion 54 has a guide post 58 for inserting the connector 52 downward, so that the connector 52 is set on the connector receiving portion 54. The connector 52 has a connector housing 59 made of a synthetic resin material and accommodates a pin terminal connected to an electrical wire. The pin terminal is locked in the connector housing 59.

The inspection portion 55 has a guide block 60 made of an insulating resin material. The guide block 60 defines a connector engagement chamber 61 accommodating a plurality of continuity sensing pins made of an electrically conductive material. The continuity sensing pins are associated with the terminals received in the connector housing 59. The continuity sensing pin (not shown) is connected to an electrical wire (not shown) The connector continuity checker 51 has a cover 62 opposed to the guide block 60 for protecting a leadwire side. The guide block 60 can horizontally slide forward and backward, for example, along a pair of guide shafts (not shown) within the frame 53.

After the connector 52 is set on the connector receiving portion 54, pivoting the actuating lever 57 in a direction B moves the inspection portion 60 toward the connector 52, so that the connector engagement chamber 61 receives a front half of the connector 52. At the same time, each continuity sensing pin contacts each terminal accommodated in the connector 52.

Each electrical wire 63 connected to each terminal of the connector communicates with an electrical continuity inspection apparatus (integrated circuit section), for exemplar through an another connector (not shown) connected to the other end of the wire 63. An electrical wire (not shown) disposed in the side of the continuity sensing pin also communicates with the continuity inspection apparatus. Thereby, the terminal of the connector 52 and the continuity sensing pin compose a closed circuit. The apparatus indicates "normal" by a lamp at a correct continuity state and indicters "abnormal" by a buzzer, a flashing light, or the like at an incorrect continuity state.

Such a connector continuity checker, which can inspect an insertion state of a terminal received in a connector housing is disclosed, for example in Japanese Patent Application Laid-open No. H. 7-113836. FIG. 4 shows the disclosed checker.

The connector continuity checker 65 has an electrically conductive, continuity sensing pin 66. A leading end of the pin 66 has an insertion inspecting pin 67 integrally formed with it. The insertion inspecting pin 67 has a fore end that can abut against an end of a flexible locking arm 69 when the arm 69 is deflecting in a connector 68.

The insertion inspecting pin 67 deviates from an axial center line of the continuity sensing pin 66 so as to oppose to a deflection space 72 of the flexible locking arm 69, when the connector 68 is set in the checker 65, that is, when the connector 68 is received in a connector engagement chamber 71 of an inspection portion 70 of the checker 65. The insertion inspecting pin 67 has, for example, a cylindrical root portion 73 that is secured to an end portion of the continuity sensing pin 66 by press fit. The continuity sensing pin 66 is resiliently urged by a coil spring 74 toward one of upper and lower terminals 76 ($76_1$, $76_2$) disposed in the connector housing 75. The leading end of the insertion inspecting pin 67 can be inserted into the deflection space 72 of the flexible locking arm 69, when an end of the continuity sensing pin 66 contacts an elastic contact piece 77 of the terminal 76.

The connector 68 having the connector housing 75 and the terminals 76 of a receptacle type is set in a connector receiving portion 78 as discussed above (FIG. 3). A front half of the connector 68 is inserted into the connector engagement chamber 71 of the inspection portion (guide block) 70.

In FIG. 4, the upper terminal $76_1$, has been incompletely inserted into the connector housing 75, so that a protrusion of the flexible locking arm 69 has been pushed by a base plate of the terminal $76_1$. Thus, the flexible locking arm 69 is kept in the deflection space 72. Thereby, the leading end of the insertion inspecting pin 67 abuts against an end of the flexible locking arm 69, preventing a further advancement of the continuity sensing pin 66. In this state, the end of the continuity sensing pin 66 does not contact the elastic contact piece 77 of the terminal 76. Accordingly, the incomplete insertion of the terminal $76_1$ is detected, because a continuity test of the terminal $76_1$ will result in an unacceptable state.

Meanwhile, the lower terminal $76_2$ of FIG. 4 is in a complete insertion state. Thus, the protrusion of the flexible locking arm 69 engages with a hole 79 formed in a base plate of a square barrel shaped electrical contact of the terminal $76_2$. Thereby, the terminal $76_2$ is locked to the square barrel contact to be prevented from drawing out rearward from a terminal accommodation chamber 80. The leading end of the insertion inspecting pin 67 enters the deflection space 72, so that the fore end of the continuity sensing pin 66 contacts the terminal $76_2$. Accordingly, a continuity test of the terminal $76_1$ will result in an acceptable state.

However, in the conventional continuity checker 65, a contact point (not limited to the elastic contact piece 77 of FIG. 4) of the terminal 76, which is associated with the continuity sensing pin 66, may be apart by a considerable distance from the deflection space 72 of the flexible locking arm 69. Thereby, the insertion inspecting pin 67 is required to considerably deviate from the continuity sensing pin 66, causing the problems of an increased size, an increased weight, and more complicated constructions of the pins 66, 67 and members associated with the pins.

Furthermore, the conventional checker 65 disadvantageously requires an increased man-hour for press-fitting the insertion inspecting pin 67 in the continuity sensing pin 66 and for correctly positioning the insertion inspecting pin 67 relative to the deflection space 72 of the flexible locking arm 69. In addition, the insertion inspecting pin 67 having the cylindrical root portion 73 is provided by machining a metal material, which disadvantageously requires a considerable manufacturing cost. Moreover, in a complete insertion state of the terminal 76, the flexible locking arm 69 may maintain its deflected position not to return its normal position because of a deformation or an undesirable nonreturn state of the flexible locking arm 69. In such an unstable state of the terminal, the continuity sensing pin 66 contacts the terminal 76, since the coil spring 74 resiliently urges the continuity sensing pin 66 to contact the terminal 76, even when the leading end of the insertion inspecting pin 67 is abutting against the opposing end of the flexible locking arm 69. This incomplete locking state of the flexible locking arm 69 is not found by the continuity checker, since the checker will determine that the continuity is acceptable.

SUMMARY OF THE INVENTION

In view of the aforementioned disadvantages, an object of the present invention is to provide a continuity checker for a connector, which can surely detect an abnormal deflection of a flexible locking arm even in a fully inserted state of a terminal. Furthermore, the checker allows a compact size, a decreased weight, and a more simplified construction of an inspecting pin even when a contact point of a terminal, which is associated with a continuity sensing pin, is considerably apart from a deflection space of the flexible locking arm. In addition the checker enables a simplified assembling thereof, decreasing an assembling man-hour and a manufacturing cost thereof.

For achieving the object, an electrical continuity checker for a connector according to a first aspect of the present invention includes a continuity sensing pin movable forward and backward, which has one end for contacting a terminal of the connector, and an insertion inspecting pin having one end insertable into a deflection space of a flexible locking arm that locks the terminal in a housing of the connector. The checker also has a circuit conductor and an electrically conductive slide resiliently urged toward the terminal of the connector. The continuity sensing pin has an opposing end contacting the circuit conductor via a resilient member, and the circuit conductor can contact the slide. The insertion inspecting pin has an opposing end that can abut against the slide. When the slide is energized by an external power source and the one end of the insertion inspecting pin abuts against the flexible locking arm, the opposing end of the insertion inspecting pin pushes the slide to disengage the slide from the circuit conductor.

According to a second aspect of the present invention, the checker further includes a circuit board arranged with the circuit conductor. The circuit board has a through hole passing the opposing end of the insertion inspecting pin. The circuit conductor has a front part disposed on a front face of the circuit board and a rear part disposed on a rear face of the circuit board. The front part electrically communicates with the rear part via a connection part disposed in the through hole. The front part of circuit conductor can contact the resilient member and the rear part of the circuit conductor can contact the slide.

According to a third aspect of the present invention, the slide is resiliently urged by a second resilient member communicating with a connection piece that can communicate with an outside circuit.

According to a fourth aspect of the present invention, the checker includes a first block and a second block, and the circuit board is disposed between the first and second blocks. The first block receives the connector. The first block accommodates the continuity sensing pin, the resilient member, and the insertion inspecting pin, while the second block accommodates the slide, the second resilient member, and the connection piece.

Next, operation of the thus configured checker will be discussed. The connector receives completely a terminal so that the flexible locking arm locks the terminal. In that state, the leading end of the insertion inspecting pin can advance into the deflection space and the slide can contact the circuit conductor. Thus, the continuity sensing pin can communicate with the connector terminal and can also communicate with the slide through the resilient member and the circuit conductor. The slide leads to an outside circuit, and the terminal leads to an electrical wire. The outside circuit and electrical wire are preliminary connected to a continuity inspection apparatus. The inspection apparatus indicates an acceptable state of the connector when a closed circuit is defined by the continuation of the terminal, the continuity sensing pin, the resilient member, the circuit conductor, and the slide.

Meanwhile, when the connector receives incompletely the terminal so that the flexible locking arm maintains a deflected state, or when the flexible locking arm does not return to its normal position due to an undesirable deformation or an undesirable nonreturn state of the flexible locking arm even in an full insertion state of the terminal,the one end of the insertion inspecting pin abuts against the leading end of the flexible locking arm. Thereby, the other end of the insertion inspecting pin positions the slide rearward against the resilient force of the elastic member. This prevents the circuit conductor from contacting the slide, so that the inspection apparatus indicates an unacceptable state of the connector.

Note that the one end of the continuity sensing pin may contact the terminal even in a slightly incomplete insertion state of the terminal. In this state, the continuity sensing pin contacts the resilient member and the circuit conductor, but the insertion inspecting pin is pushing the slide in the disengagement direction thereof. Thus, the inspection apparatus indicates an unacceptable slate of the connector.

DETAILED DESCRIPTION OF THE PREFERRED EMBODIMENTS

Referring to the accompanied drawings, an embodiment of the present invention will be discussed in detail hereinafter.

Figure 1:
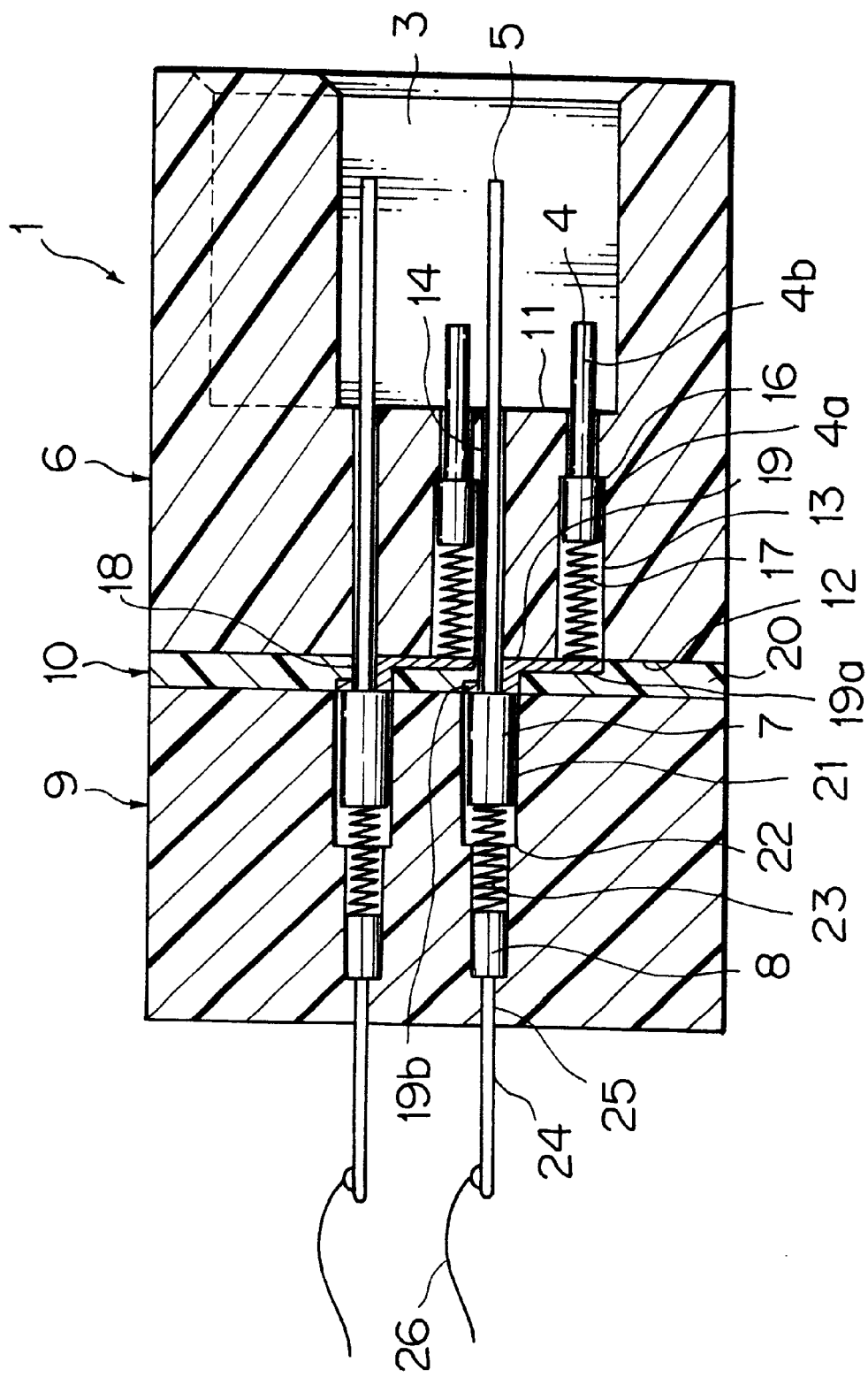
FIG. 1 is a sectional view showing an embodiment of an electrical continuity checker for a connector according to the present invention.
Figure 2:
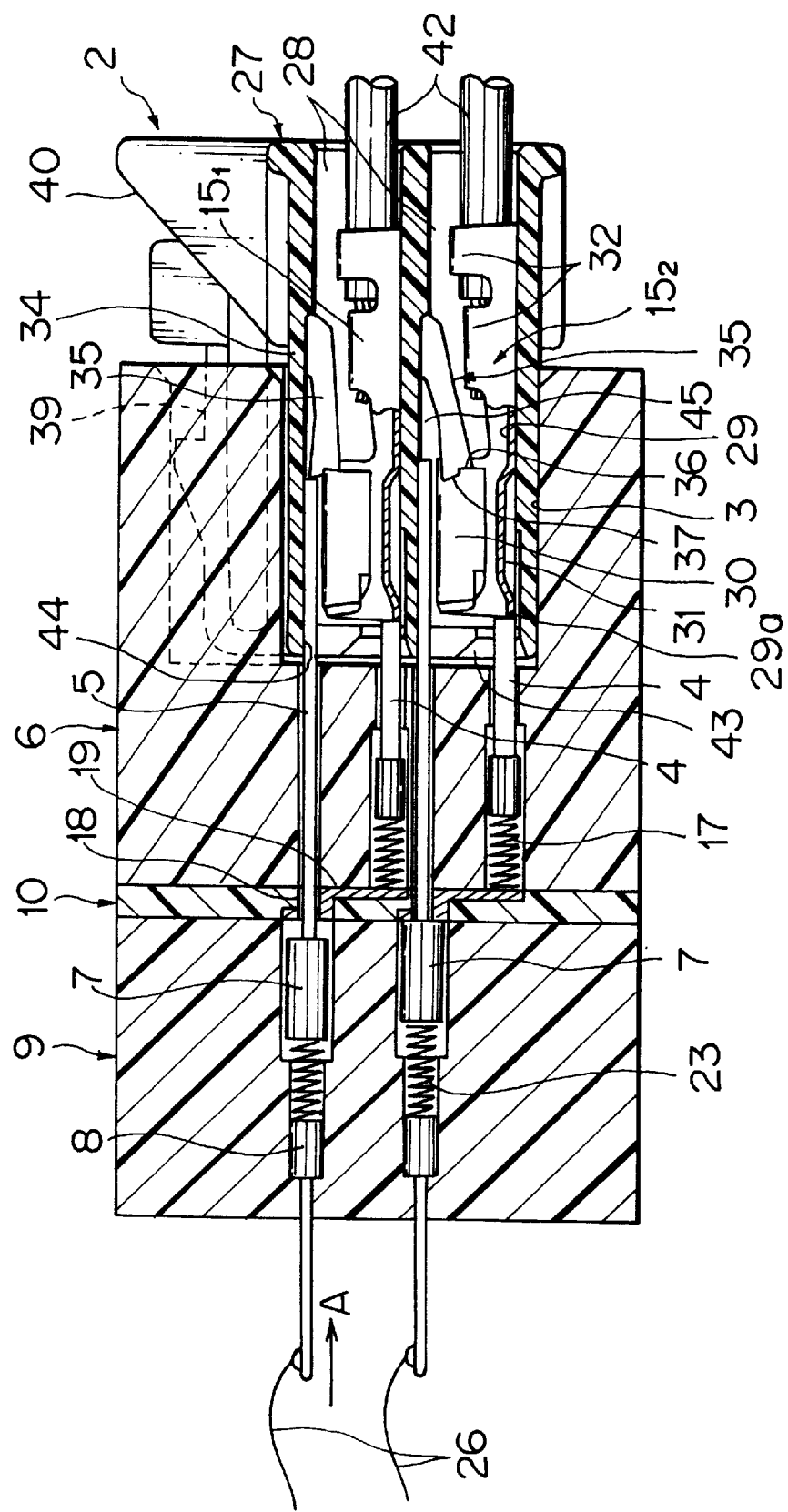
FIG. 2 is a sectional view showing a state in which the checker receives a connector to inspect electrical continuity thereof.
Figure 3:
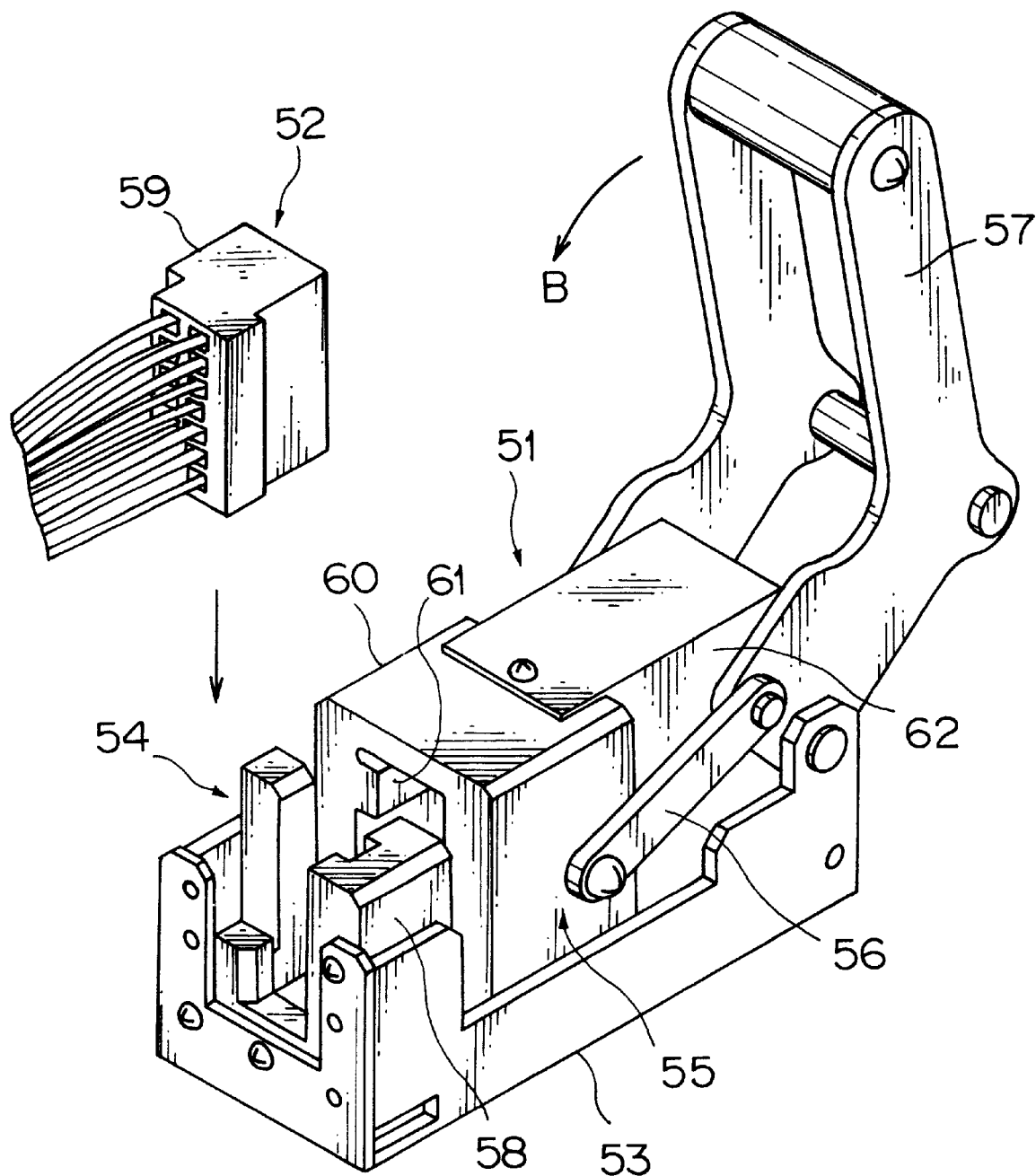
FIG. 3 is an exploded perspective view showing a conventional connector continuity checker.

FIG. 1 is a sectional view showing an embodiment of an electrical continuity checker for a connector according to the present invention. FIG. 2 is a sectional view showing a state in which the connector continuity checker receives a connector to inspect electrical continuity thereof. FIGS. 1 and 2 substantially show only an inspection portion 1 of the checker, while a connector receiving portion, a frame, a lever, etc. will not be discussed again, since they are substantially the same as those of the conventional one (FIG.

3). Note that the connector receiving portion could be omitted and a connector 2 (FIG. 2) may be handled by hand to set it in the inspection portion 1.

As illustrated in FIG. 1, the inspection portion includes a fore guide block (first block) 6 made of an insulating resin material, a pin side block (second block) 9 made of an insulating resin material, and a circuit board 10 sandwiched between the guide block 6 and the pin side block 9. The guide block 6 has a connector engagement chamber 3, a continuity sensing conductor pin 4, and an insertion inspecting pin 5 made of an insulating material. The continuity sensing pin 4 and the insertion inspecting pin 5 are extending into the connector engagement chamber 3. The pin side block has a conductive slide 7 joined to the insertion inspecting pin 5 and has a connection piece 8 electrically communicating with the slide 7. The circuit board 10 can electrically communicate the continuity sensing pin 4 with the slide 7.

The connector engagement chamber 3 is positioned in a fore half of the guide block 6. Through an end wall 11 of the connector engagement chamber 3 and a rear end wall 12 of the guide block, there are defined through holes 13, 14 for passing the continuity sensing pin 4 and the insertion inspecting pin 5. In this embodiment, two rows of the pins 4, 5 are provided to correspond with upper and lower terminals 15 ($15_1$, $15_2$) of the connector 2 (FIG. 2). Plural sets of the terminals 15 (FIG. 2) and the pins 4, 5 may be applicable for the checker.

The through hole 13 for the continuity sensing pin 4 has a step 16 at an intermediate portion thereof to define a fore, smaller diameter part and a rear, larger diameter part of the hole 13. The continuity sensing pin 4 is resiliently urged forward (toward the terminal) in the through hole 13 by a compressed coil spring (first resilient member) 17 made of a conductive metal material. The continuity sensing pin 4 has a larger diameter portion 4a that abuts against the step 16 to limit the foremost position of the continuity sensing pin 4. The foremost position of the insertion inspecting pin 5 may be limited in the same way as the continuity sensing pin 4 or by a stopper (not shown).

The continuity sensing pin 4 has a smaller diameter portion 4b and the above-mentioned larger diameter portion 4a that is extending shortly backward from the smaller diameter portion 4b. The smaller diameter portion 4b is extending into the connector engagement chamber 3 from the through hole 13. Between a rear end of the larger diameter portion 4a and a front surface of the circuit board 10, there is disposed a compressed coil spring 17 to resiliently urge the continuity sensing pin 4 forward. The continuity sensing pin 4 may be formed by machining a conductive metal piece to define the smaller diameter portion 4b and the larger diameter portion 4a in a body.

The insertion inspecting pin 5 has a length larger than the continuity sensing pin 4 and a diameter smaller than the continuity sensing pin 4. The fore end of the insertion inspecting pin 5 is positioned to extend by a larger extent than the fore end of the continuity sensing pin 4. The insertion inspecting pin 5 passes a through hole 18 of the circuit board 10. A rear end of the insertion inspecting pin 5 is joined to a fore end of the slide 7 arranged in the pin side block 9.

On the circuit board 10, there is disposed a circuit conductor 19. The circuit conductor 19 is arranged from a front surface of the circuit board 10 to a rear surface of the circuit board 10 through an inner surface of the through 18 passing the insertion inspecting pin 5. The circuit conductor 19 has a front surface portion 19a that extends to a rear opening of the through hole 13 related to the continuity sensing pin 4 of the guide block 6. Thus, the circuit conductor 19 contacts a rear end of the conductive coil spring 17 in the through hole 13. The circuit conductor 19 is constituted by a conductive metal piece such as a solder material, a printed circuit, a copper substrate, or a busbar. The circuit conductor 19 has a rear surface portion 19b disposed on a rear surface of the circuit board 10. The rear surface portion 19b is arranged so as to surround a circumferential periphery of the through hole 18. The circuit board 10 consists of an insulating base plate 20 and the circuit conductor 19. In FIG. 2, there are disposed upper and lower circuit conductors 19, which are separated from each other on the circuit board 10 so as to correspond with the upper and lower terminals 15.

The front face conductor 19a of the circuit board 10 can be easily provided to be desirable in length and shape by printing or the like, even when there is a considerable distance between the continuity sensing pin 4 and the insertion inspecting pin 5. The defined circuit conductor 19 is more compact than an electrical wire (not shown) to minimize the inspection portion 1 and has interference problems less than the electrical wire.

The insertion through hole 18 of the circuit board 10, which receives the insertion inspecting pin 5, co-axially communicates with a through hole 21 of the pin side block 9. The through hole 21 has a diameter larger than the insertion through hole 18 of the circuit board 10, and the diameter is substantially the same as that of the through hole 13 for the continuity sensing pin provided in the guide block 6. The conductor 19b disposed on the rear face of the circuit board 10 is positioned to oppose to a fore opening of the through hole 21 of the pin side block 9.

The through hole 21 has a step 22 at an intermediate portion thereof to define a fore, larger diameter portion and a rear, diameter portion of the through hole 21. In the larger diameter portion of the through hole 21, there is disposed the slide 7 made of a conductive metal material and having a circular-column shaped. The slide 7 can move longitudinally by a short distance. A rear half of the smaller diameter portion of the through hole 21 receives and fixes the connection piece 8. Between the connection piece 8 and the slide 7, there is disposed a compressed coil spring (second resilient member) 23 made of a conductive metal material. The coil spring 23 has a fore end resiliently abutting against the rear end of the slide 7, while a rear end of the coil spring 23 resiliently abuts against the fore end of the connection piece 8. The fore end of the slide 7 contacts the rear face conductor 19b of the circuit board 10 by a resilient force of the coil spring 23. The connection piece 8 is connected to a small-diameter lead terminal 24 extending rearward. The lead terminal 24 is extended to the outside of the pin side block 9 through a small-diameter hole 25 adjacent to the through hole 21. The terminal 24 is connected to an outside circuit (electrical wire) 26.

As illustrated in FIG. 2, a fore half of the connector 2 is inserted from a fore opening of the connector engagement chamber 3 of the guide block 6 by actuation of a lever (not shown) or directly by hand. The connector 2 has a connector housing 27 with a terminal accommodation chamber 28 in which the receptacle terminal 15 is inserted to be locked therein. The terminal 15 has a base plate 29, an electrical contact portion 31 consisting of a pair of left and right contact barrels 30 curved like a spectacle shape at one side thereof, and a wire crimping portion 32 at the other side thereof. A pin terminal of an opposing associated connector (not shown) will be inserted between contact barrels 30 and the base plate 29.

The terminal accommodation chamber 28 has an outer wall 34 from which a flexible locking arm 35 extends diagonally forward. The flexible locking arm 35 has a step 36 at a fore end portion thereof for locking a rear end of the contact barrel 30. The flexible locking arm 35 has a fore end portion 37 forwardly adjacent to the step 36. The connector housing 27 has an outer wall provided with a lock arm 39 for the opposing associated connector and has a vertical protection wall 40 at a rear portion thereof to prevent an incorrect action of the lock arm 39.

When the terminal 15 is fully inserted into the connector 2, the leading end of the base plate 29 of the terminal 15 abuts against the fore end of the continuity sensing pin 4. The terminal 15 pushes the continuity sensing pin 4. Thereby, the continuity sensing pin 4 slidingly moves backward but keeps contact with the terminal 15 by a resilient force of the coil spring 17.

Figure 4:
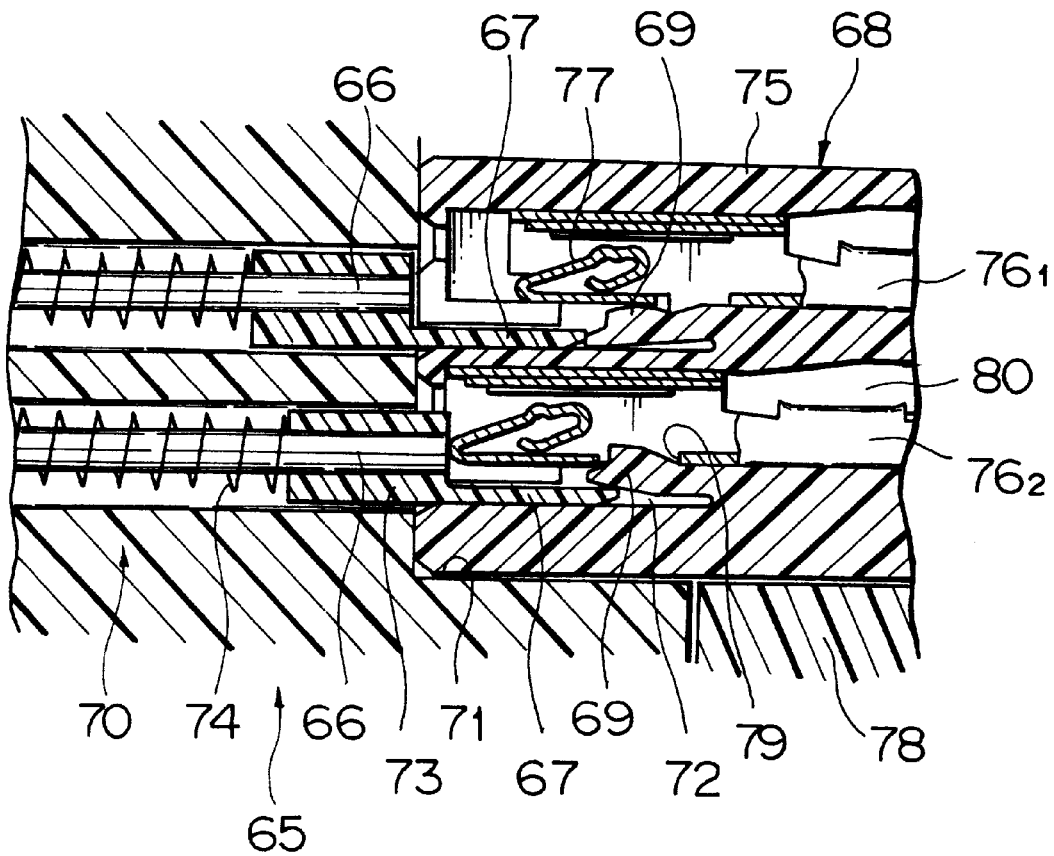
FIG. 4 is a sectional view showing another conventional connector continuity checker.

The flexible locking arm 35 may be undesirably caught on the terminal 15 not to return its original position in a full insertion state of the terminal 15 to be in a deflected position like the upper terminal $15_1$. Or, the flexible locking arm 35 may be in a deflected position because of an incomplete insertion of the terminal 15 like the conventional example (FIG. 4). In such cases, the leading end of the insertion inspecting pin 5 abuts against the forward end of the flexible locking arm 35, so that the insertion inspecting pin 5 pushes the slide 7 to move it backward.

Thus, the conductive slide 7 disengages from the circuit conductor 19 of the circuit board 10, so that an electrical wire 42 connected to the terminal 151 does not electrically communicate with the electrical cable 26 connected to the connection piece 8. That is, an electrical signal supplied from a continuity inspection apparatus (not shown) in a direction shown by an arrow head A is interrupted at the slide 7, so that the continuity inspection apparatus which communicates with the wires 26, 42 indicates an unacceptable state of the connector. Hence, an abnormal state of the flexible locking arm 35 is not overlooked even when the continuity sensing pin 4 is contacting the terminal $15_1$. Naturally, an unacceptable continuity state of the connector is indicated when the terminal 15 is not fully inserted so that the continuity sensing pin 4 is not contacting the terminal 15.

Meanwhile, the terminal $15_2$ of FIG. 2 has been fully inserted into the terminal accommodation chamber 28, and the flexible locking arm 35 is correctly locking the terminal $15_2$. In this state, the terminal $15_2$ electrically communicates with the connection piece 8 through the continuity sensing pin 4, the coil spring 17, the circuit conductor 19, the slide 7, and the coil spring 23. Thus, a closed circuit is defined among the electrical wire 42 of the terminal 152, the continuity inspection apparatus, and the electrical wire 26 of the connection piece, so that the inspection apparatus indicates an acceptable state of the connector.

The leading end of the continuity sensing pin 4 can abut against the foremost end of the terminal 15. That is, the continuity sensing pin 4 does not abut against the elastic contact piece 30 which is spaced from the foremost end but abuts against the fore end 29a of the base plate 29. This allows a reduced insertion distance of the continuity sensing pin 4 to reduce the size of the continuity sensing pin 4, preventing an undesirable lateral deviation of the pin 4. The continuity sensing pin 4 can be correctly inserted along an inner guide surface of a fore insertion opening 43 of the connector housing toward the foremost end of the terminal 15.

The insertion inspecting pin 5 is also inserted along an upper inner wall 34 of the terminal accommodation chamber 28 through an opening 44 formed in the fore end of the connector housing toward the flexible locking arm 35. Thereby, the insertion inspecting pin 5 is correctly positioned relative to the flexible locking arm 35. Note that the opening 44 is also used for the disengagement of the terminal. The length of the insertion inspecting pin 5 is determined such that the insertion inspecting pin 5 receives a force enough small not to move backward the slide 7 when the fore end of the insertion inspecting pin 5 has advanced into a deflection space 45 of the flexible locking arm 35.

In the embodiment, the coil spring 17 may be omitted by providing a resilient member which is integrally defined with the front face conductor 19a of the circuit board 10. In place of the slide 7, there may be provided a conductive slide plate (not shown) connected to the fore end of the coil spring 23. The slide plate can reduce the length of the pin side block 9. Furthermore, in place of the slide 7, there may be provided an elastic contact piece (not shown) contacting the circuit conductor 19 in the pin side block 9. This can eliminate the need for the coil spring 23.

The insertion inspecting pin 5 may be made of a conductive metal material in place of an insulating resin material, when the pin 5 has no possibility of contact with the terminal 15. The pin 5 may be made of a conductive metal material with an insulating coating thereon. Furthermore, in place of the circuit board 10, there may be arranged a circuit conductor 19 on a fore end surface of the pin side block 9, and, on an inner surface of the through hole 21 extended from the fore end of the pin side block 9, there may be provided a circuit conductor 19b contacting the slide 7.

Operational Effects of the Invention

As described above, in the first aspect of the present invention, the continuity sensing pin resiliently contacting the terminal electrically communicates with the slide abutting against the insertion inspecting pin by way of the circuit conductor. The circuit conductor may be substantially flat even when there should be provided a comparatively larger space between the continuity sensing pin and the insertion inspecting pin according to the type of the connector. This allows a reduced size and a reduced weight of the connector continuity checker. Note that the circuit conductor may be desirable in length and shape to apply to various types of connectors with ease. Furthermore, the provision of the circuit conductor separates the continuity sensing pin from the insertion inspecting pin to allow a simplified construction related to the continuity sensing pin as compared with the conventional checker (FIG. 4). This enables an easy assembling of the connector continuity checker, allowing a reduced assembling man-hour and a reduced manufacturing cost thereof. Furthermore, when the flexible locking arm does not return to its normal position due to an undesirable deformation or an undesirable nonreturn state of the flexible locking arm even in a full insertion state of the terminal, the insertion inspecting pin abuts against the flexible locking arm. This prevents the circuit conductor from contacting the slide, so that the inspection apparatus surely indicates an acceptable state of the connector.

The continuity sensing pin resiliently abuts against the circuit conductor through the resilient member, ensuring an electrical connection between them even with a variable stroke of the continuity sensing pin. With a force of the resilient member, the continuity sensing pin touches a surface of the circuit conductor at every stroke thereof, which keeps the surface of the circuit conductor in an appropriate state without oxidization of the surface.

In the second aspect of the invention, the provision of the circuit board allows an easy arrangement of the circuit conductor and enables a simplified construction and an easy assembling of the checker. In addition, on an inner surface of the circuit board through hole passing the insertion inspecting pin, there is disposed the conductor connecting the front and rear surface conductors. This is advantageous for a simplified design of the checker.

In the third aspect of the invention, the second resilient member urges the slide to abut against the circuit conductor, ensuring the slide to contact the circuit conductor. The second resilient member also urges the insertion inspecting pin to surely abut against the locking arm while the locking arm has been deflected.

In the fourth aspect of the invention, the blocks are formed separately from each other, allowing an easy assembling of the continuity sensing pin, the continuity sensing pin, resilient members, and the slide. The provision of the circuit board between the blocks is advantageous for easily assembling the circuit board to complete the checker.

What is claimed is:

1. An electrical continuity checker for a connector comprising:

a continuity sensing pin movable forward and backward, which has one end for contacting a terminal of the connector, an insertion inspecting pin having one end insertable into a deflection space of a flexible locking arm that locks the terminal in a housing of the connector, a circuit conductor, and an electrically conductive slide resiliently urged toward the terminal of the connector, wherein the continuity sensing pin has an opposing end contacting the circuit conductor via a resilient member, and the circuit conductor can contact the slide, the insertion inspecting pin having an opposing end that can abut against the slide, whereby, when the slide is energized by an external power source and the one end of the insertion inspecting pin abuts against the flexible locking arm, the opposing end of the insertion inspecting pin pushes the slide to disengage the slide from the circuit conductor.

2. The checker set forth in claim 1 further comprising a circuit board arranged with the circuit conductor, the circuit board having a through hole passing the opposing end of the insertion inspecting pin, wherein, the circuit conductor has a front part disposed on a front face of the circuit board and a rear part disposed on a rear face of the circuit board, the front part electrically communicating with the rear part via a connection part disposed in the through hole, the front part of circuit conductor being able to contact the resilient member, the rear part of the circuit conductor being able to contact the slide.

3. The checker set forth in claim 1 wherein the slide is resiliently urged by a second resilient member communicating with a connection piece that can communicate with an outside circuit.

4. The checker set forth in claim 2 wherein the checker includes a first block and a second block and the circuit board is disposed between the first and second blocks, the first block receiving the connector, the first block accommodating the continuity sensing pin, the resilient member, and the insertion inspecting pin, the second block accommodating the slide, the second resilient member, and the connection piece.

* * * * *